United States Patent
Schett et al.

(10) Patent No.: US 9,903,923 B2
(45) Date of Patent: Feb. 27, 2018

(54) SHUTTLE FOR AN NMR MAS ROTOR

(71) Applicant: BRUKER BIOSPIN AG, Faellanden (CH)

(72) Inventors: Oskar Schett, Uster (CH); Daniel Guy Baumann, Faellanden (CH); Franco Sestito, Winterthur (CH); Markus Mayer, Gossau (CH)

(73) Assignee: Bruker BioSpin AG, Faellanden (CH)

( * ) Notice: Subject to any disclaimer, the term of this patent is extended or adjusted under 35 U.S.C. 154(b) by 500 days.

(21) Appl. No.: 14/599,582

(22) Filed: Jan. 19, 2015

(65) Prior Publication Data
US 2015/0204952 A1    Jul. 23, 2015

(30) Foreign Application Priority Data
Jan. 22, 2014    (DE) .................. 10 2014 201 076

(51) Int. Cl.
*G01R 33/30*    (2006.01)
(52) U.S. Cl.
CPC .................. *G01R 33/307* (2013.01)
(58) Field of Classification Search
CPC ..................................................... G01R 33/307
See application file for complete search history.

(56) References Cited

U.S. PATENT DOCUMENTS

| | | | | |
|---|---|---|---|---|
| 4,088,944 A | * | 5/1978 | Engler | G01R 33/307 324/321 |
| 4,511,841 A | * | 4/1985 | Bartuska | G01R 33/307 324/318 |
| 5,146,166 A | * | 9/1992 | Bartuska | G01R 33/307 324/321 |
| 5,150,054 A | | 9/1992 | Dupree | |
| 5,184,078 A | * | 2/1993 | Rapoport | B01L 9/00 324/321 |
| 5,517,856 A | * | 5/1996 | Hofmann | G01R 33/30 324/321 |
| 5,534,780 A | * | 7/1996 | Lilly | G01R 33/307 324/321 |

(Continued)

FOREIGN PATENT DOCUMENTS

| | | |
|---|---|---|
| JP | S5474795 | 6/1979 |
| JP | 61149863 | 7/1986 |

OTHER PUBLICATIONS

Bruker BioSpin AG, "Bruker Sample Transport" Faellanden, Schweiz, Nov. 21, 2008.

*Primary Examiner* — G. M. Hyder
(74) *Attorney, Agent, or Firm* — Paul Vincent

(57) ABSTRACT

A transport device for transporting an NMR sample to the probe head (16) of an NMR spectrometer by means of a transport system (12) is characterized in that the transport device comprises a shuttle (15) adapted for use with a transport system. The transport system is structured to transport an HR-NMR sample spinner or an NMR MAS rotor (5). The shuttle includes a locking device for the NMR MAS rotor, the locking device being formed such that the NMR MAS rotor is released by unlocking the locking device and can be transferred to and received by the NMR MAS probe head. It is therefore possible to rapidly change from NMR spectroscopy of liquids to NMR spectroscopy of solids, and vice versa, simply by exchanging the probe head, without converting the transport system.

7 Claims, 2 Drawing Sheets

(56) References Cited

U.S. PATENT DOCUMENTS

| | | | | |
|---|---|---|---|---|
| 5,952,831 | A | 9/1999 | Yamakoshi | |
| 6,969,993 | B2 * | 11/2005 | Tschirky | G01R 33/46 |
| | | | | 324/318 |
| 7,718,135 | B2 * | 5/2010 | Himmelsbach | G01R 33/307 |
| | | | | 324/308 |
| 8,192,702 | B2 * | 6/2012 | Norell | B01L 3/00 |
| | | | | 414/800 |
| 8,217,655 | B2 * | 7/2012 | De Vries | G01R 33/307 |
| | | | | 324/321 |
| 9,279,869 | B2 | 3/2016 | Shinagawa | |
| 2002/0135372 | A1 | 9/2002 | Warden | |
| 2002/0196022 | A1 | 12/2002 | Tschirky | |
| 2002/0196023 | A1 | 12/2002 | Hofmann | |
| 2005/0052184 | A1 | 3/2005 | Haner | |
| 2005/0062474 | A1 * | 3/2005 | Tschirky | G01R 33/46 |
| | | | | 324/321 |
| 2006/0173380 | A1 | 8/2006 | Hoenos | |
| 2007/0202017 | A1 | 8/2007 | Himmelsbach | |
| 2008/0088312 | A1 | 4/2008 | Spraul | |
| 2009/0270763 | A1 | 10/2009 | Konya | |
| 2010/0026302 | A1 | 2/2010 | Doty | |
| 2010/0109666 | A1 | 5/2010 | Armbruster | |
| 2013/0207656 | A1 | 8/2013 | Shinagawa | |
| 2014/0125340 | A1 * | 5/2014 | Hunkeler | G01R 33/307 |
| | | | | 324/321 |

* cited by examiner

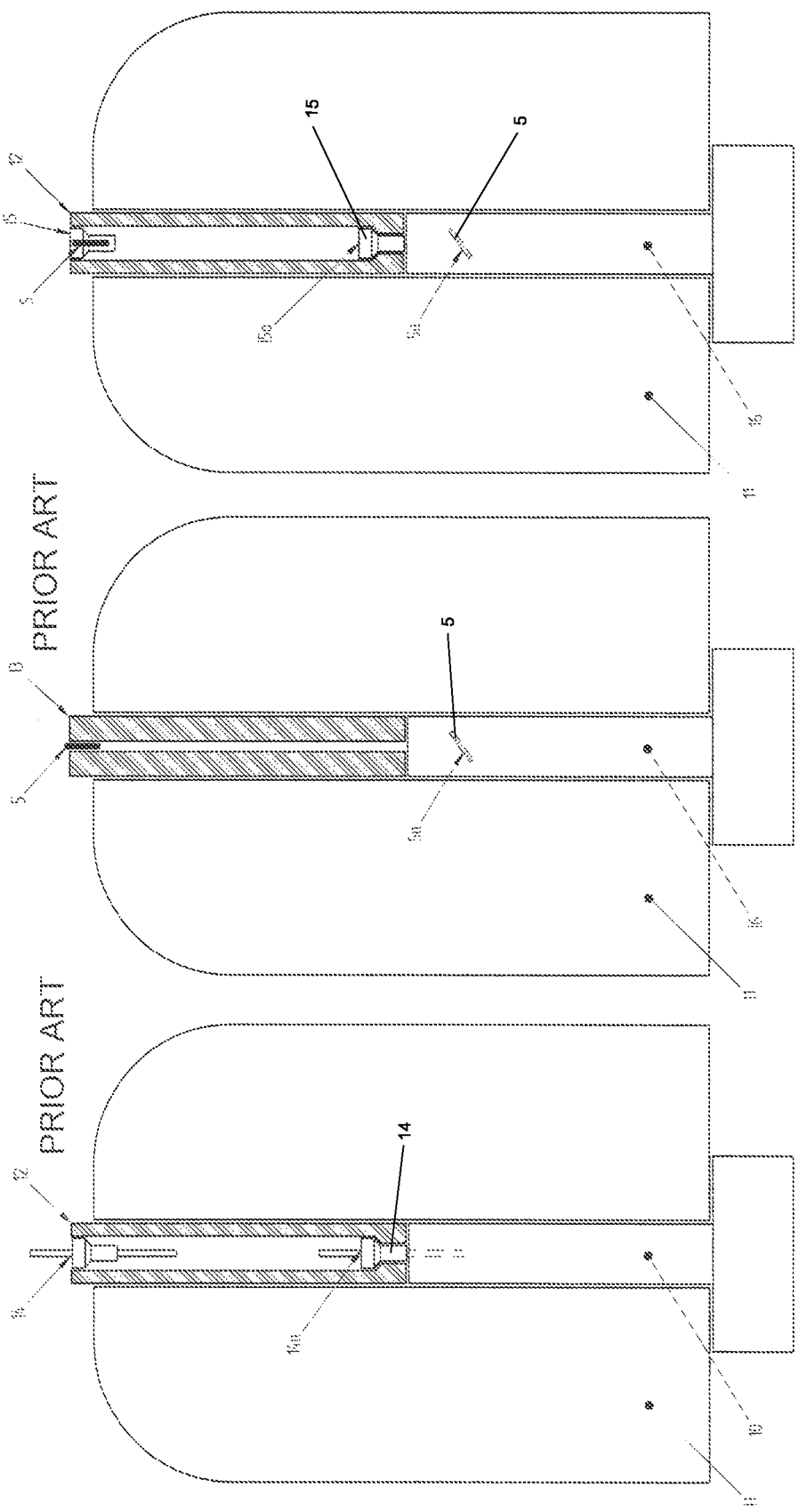

SHUTTLE FOR AN NMR MAS ROTOR

This application claims Paris convention priority from DE 10 2014 201 076.4 filed Jan. 22, 2014 the entire disclosure of which is hereby incorporated by reference.

BACKGROUND OF THE INVENTION

The invention relates to a transport device for transporting an NMR sample to the probe head of an NMR (Nuclear Magnetic Resonance) spectrometer by means of a transport system.

Such a transport device is known, for example, from the company brochure "Z31123 Bruker Sample Transport," version 002, of Bruker BioSpin AG, dated Nov. 21, 2008 (Reference [1]).

NMR methods are used for analyzing sample compositions or for determining the structure of substances in samples. NMR spectroscopy is an efficient method for instrumental analysis. In these NMR methods, the sample is exposed to a strong static magnetic field $B_0$ in a z-direction, and for this purpose high-frequency electromagnetic pulses orthogonal thereto are irradiated into the sample in the x- or y-direction. This results in interaction with the nuclear spins of the sample material. The temporal development of these nuclear spins of the sample, in turn, generates high-frequency electromagnetic fields which are detected in the NMR apparatus. The detected RF (radio frequency) fields can provide information about the properties of the sample. In particular, the position and intensity of NMR lines allow conclusions to be drawn concerning the chemical bonding properties in the sample.

In NMR spectroscopy of liquids, the sample in a sample tube is brought into the probe head towards the magnetic field lines, and is examined while stationary or during rotation. For the transport and the rotation, a so-called spinner is used which firmly holds the sample tube and which, as a rotor of a turbine arranged above the magnetic center, can be rotated on an air bearing at a moderate frequency (typically 20 Hz).

In NMR spectroscopy of solids, the sample is introduced directly into a rotor in which the sample is transported into the probe head, which is rotated in the magnetic center at high frequency (typically several kHz) during the measurement at the "magic angle" (arctan√2, approximately 54.74°) with respect to the magnetic field lines in the stator of a turbine.

In many laboratories, NMR spectroscopy of both liquids and solids is performed with the same NMR system.

Due to the completely different shape and size of the sample tubes and spinners used in NMR spectroscopy of liquids, and of the rotors used in NMR spectroscopy of solids, it is necessary according to the prior art that the respective transport systems are also different.

A schematic arrangement for NMR spectroscopy of liquids according to the prior art known, for example, from Reference [1] is illustrated in FIG. 4. The HR (High Resolution)-NMR probe head (10) is installed in an NMR magnet (11) so that the magnetic field required for the measurement is present at the measurement site. By means of an HR-NMR transport system (12), the HR-NMR sample spinner (14), which is filled with the liquid to be examined and inserted into a spinner, is transported pneumatically as a whole to the measuring position (14a) to the HR-NMR probe head (10), and after the measurement is transported back to the starting position.

A schematic arrangement for NMR spectroscopy of solids according to the prior art is illustrated in FIG. 5. The MAS (magic angle spinning) probe head (16) is installed in an NMR magnet (11) so that the magnetic field required for the measurement is present at the measurement site. By means of an MAS rotor transport system (13), the rotor (5) filled with the substance to be examined is pneumatically transported to the measuring position (5a) of the MAS probe head (16), and after the measurement is transported back to the starting position. For the measurement, the rotor axis is tilted by the "magic angle."

The disadvantage here is that two different transport systems (HR-NMR 12 and MAS rotor 13) and two types of automation devices for sequentially feeding a large number of samples have to be provided for an NMR system, and that when changing from NMR spectroscopy of liquids to NMR spectroscopy of solids and vice versa, complicated conversions of the transport system are necessary each time, which is particularly laborious if additional automation devices are also used, as described in Reference [2], for example.

A possible solution according to the prior art is described in Reference [3]. Here, the NMR MAS rotor (5) is not fed from above by a transport system, but, rather, is fed from below through the MAS probe head (16) so that the HR-NMR transport system (12) for HR-NMR sample spinners can remain stationary. However, the disadvantage of this solution is the significant space requirement within the MAS probe head (16).

It is therefore an object of the invention to be able to rapidly change from NMR spectroscopy of liquids to NMR spectroscopy of solids, and vice versa, without converting the transport system, but instead, only by exchanging the probe head. It is intended that in both cases the same transport system and in particular also the same automation devices for sequentially feeding a large number of samples can be used, without conversion, with existing NMR MAS probe heads as well as with MAS rotors.

SUMMARY OF THE INVENTION

This object is achieved in a surprisingly simple and effective manner in that the transport device has a shuttle, the outer contour of which has a geometric shape such that the shuttle can be used, on the one hand, with a transport system which is designed for the transport of an HR-NMR sample spinner comprising an inserted sample tube and, on the other, is also designed for the transport of an NMR MAS rotor, and that the shuttle includes a locking device for the NMR MAS rotor, the locking device being formed in such a way that when attaching the shuttle to the NMR MAS probe head, the NMR MAS rotor is released by unlocking the locking device and can be transferred to and received by the NMR MAS probe head.

Thus, the present invention proposes a shuttle which enables an NMR MAS (nuclear magnetic resonance at the magic angle) rotor to be fed and transferred to a probe head or another device, e.g., for preparing the rotors, or to receive the NMR MAS rotor therefrom and transport it away, wherein the shuttle is configured such that the same transport system as the one that is used for the transport of HR-NMR sample spinners can be used, and the transport system includes a locking mechanism which releases the rotor for the transfer to the device and holds it firmly upon receiving it.

The rotor used in NMR spectroscopy of solids is therefore not transported separately, but instead is transported within the shuttle according to the invention which, in terms of its outer contour, corresponds to the spinners that are used for transporting the sample tubes in NMR spectroscopy of liquids, and which has a locking device for the rotor, which locking device releases the rotor for the transfer to the probe head or to another device, e.g. for automated preparation of the rotor, and holds it firmly again upon receiving it.

Another procedure is described in Reference [4], where a shuttle is likewise used for an inserted sample tube, but in this case, however, the sample tube is not transferred to the probe head, but instead remains in the shuttle and is exactly positioned with respect to same. As a result, this shuttle is not suitable for NMR MAS applications, since the sample tube thus cannot be tilted by the magic angle.

Reference [5] describes a solution for automatically loading the shuttle used in Reference [4], and Reference [6] and Reference [7] each describe an improved centering of the sample tube in a shuttle used in Reference [4].

In one preferred embodiment of the transport device according to the invention, the locking device is formed in such a manner that manual loading and removal of an NMR MAS rotor is also possible by manually actuating the locking device. The locking device can be actuated not only when attaching it to an MAS probe head or another device, but also manually at will by means of a simple pusher.

Particularly preferred is an embodiment of the invention in which the locking device comprises one or more control slides which are displaceable in a longitudinal axis and transport axis of the shuttle when attaching it on the NMR MAS probe head, and the locking device in each case comprises one locking element which is actuated transversely thereto via a slotted control guide of the control slide. The locking device is actuated when the shuttle is attached to the MAS probe head or another device.

A first refinement of this embodiment, which can be implemented in a particularly simple manner, provides that the locking element holding the NMR MAS rotor is spherical.

In an alternative refinement, the locking element holding the NMR MAS rotor, after unlocking by linearly displacing a tappet, can be moved to the side by the gravity-loaded NMR MAS rotor.

Another advantageous embodiment of the transport device according to the invention is characterized in that an additional device is present which makes it possible to recognize from the outside if the shuttle at that moment is loaded with an NMR MAS rotor. For this purpose, an additional component is displaced by the rotor inserted in the shuttle in such a manner that it can be detected from the outside on the shuttle, visually or by means of sensors, whether or not the shuttle is loaded with an MAS rotor.

A method for transporting an NMR MAS rotor from and to an NMR MAS probe head by means of a transport device of the aforementioned kind also falls within the scope of the present invention, which method is characterized in that via one or more gas flows, on the one hand, the NMR MAS rotor is transported into the shuttle and, on the other, the shuttle itself is transported.

The invention is illustrated in the drawing and is explained in greater detail by means of exemplary embodiments. In the figures:

BRIEF DESCRIPTION OF THE DRAWING

FIG. 4 shows a schematic arrangement for NMR spectroscopy of liquids according to the prior art known, for example, from Reference [1];

FIG. 5 shows a schematic arrangement for NMR spectroscopy of solids according to the prior art; and FIG. 6 shows a schematic arrangement for NMR spectroscopy of solids, using the shuttle according to the invention.

DESCRIPTION OF THE PREFERRED EMBODIMENT

Figure 1:
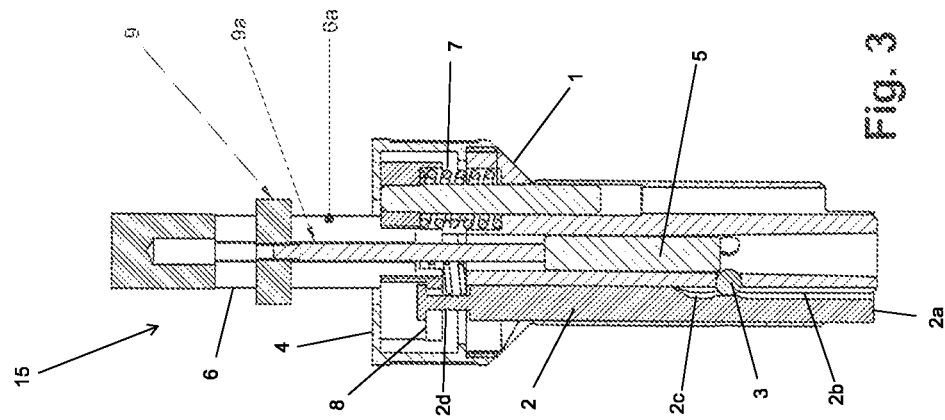
FIG. 1 shows a schematic illustration of a first embodiment of the shuttle according to the invention for an MAS rotor.

FIG. 1 schematically illustrates a first embodiment of the shuttle 15 according to the invention for an NMR MAS rotor 5. The shuttle 15 is composed of a base body 1 having a cover 4, which is configured in terms of its outer dimensions in such a manner that it can be used with transport systems 12 which are designed for the transport of HR-NMR sample spinners 14 (see FIG. 4). One or more control slides 2 with a corresponding locking element 3 is/are inserted therein. The locking element 3 holds the NMR MAS rotor 5. When the shuttle is placed on an MAS probe head 16 (see FIG. 6) or another device, a suitable structure on the MAS probe head 16 or on the other device moves the control slide 2 by pressure applied on the actuating face 2a thereof relative to the base body 1 in the upward direction; the locking element 3 can be diverted through the slotted control guide 2b of the control slide 2, and releases the MAS rotor 5.

Figure 2:
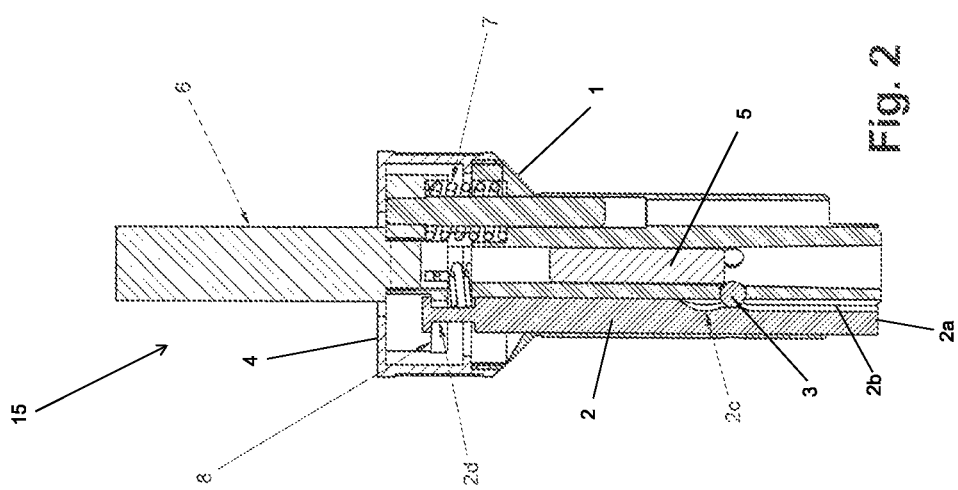
FIG. 2 shows a second embodiment of the shuttle for an MAS rotor with manual actuation of the locking device.

In FIG. 2, an embodiment is illustrated in which the control slide 2 can be actuated automatically by pressure applied to the actuating face 2a when attaching it to an MAS probe head 16 (see FIG. 6) or another device and can also be actuated manually by a simple push actuator 6. For this purpose, a second slotted control guide 2c is provided on the control slide 2, which releases the locking element 3 when the control slide 2 is moved downwards. The control slide 2 then rests with its additional stop 2d against a plate 8 which is loaded by the spring 7 and fixedly connected to the push actuator 6.

Figure 3:
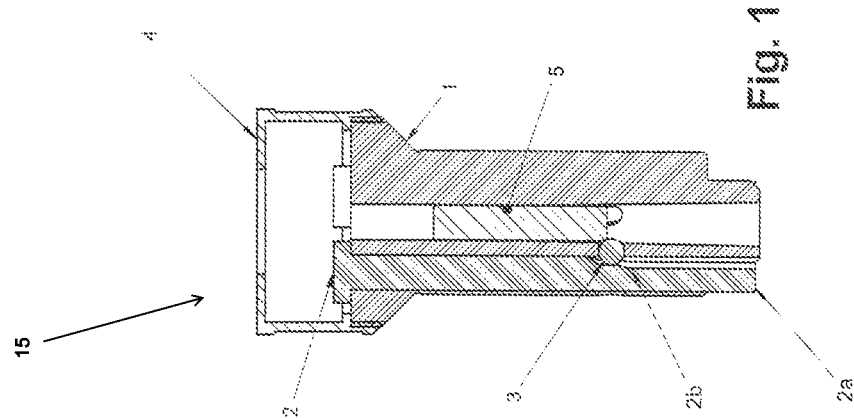
FIG. 3 shows a third embodiment of the shuttle for an MAS rotor with a device for indicating whether the shuttle is loaded with an MAS rotor.

FIG. 3 shows an embodiment in which an additional indicator component 9 is displaced by the MAS rotor 5 inserted in the shuttle 15 in such a manner that it can be detected from the outside on the shuttle 15, visually or by means of sensors, whether or not the shuttle 15 is loaded with an MAS rotor 5. This indicator component 9 is connected to an actuating rod 9a which rests directly on the MAS rotor 5 and is lifted by the latter. The indicator component 9 is located in a recess 6a within the push actuator 6.

Receiving of the MAS rotor 5 by a MAS probe head 16 or another device can take place as follows: The MAS rotor 5 is lifted into the shuttle 15 by a gas flow. The magnitude of the gas flow is to be just strong enough that only the MAS rotor 5 is lifted thereby, but not the shuttle 15 itself. Only after the MAS rotor 5 is located inside the shuttle 15 is the shuttle 15 together with the MAS rotor 5 located therein lifted by increasing the above-described gas flow or by connecting a further gas flow. As a result, the actuation of the control slide 2 via its actuating face 2a is discontinued, the control slide 2 moves downwardly relative to the shuttle 15, and the locking element 3 is displaced inwardly such that the MAS rotor 5 is held securely and without gas flow in the shuttle 15.

Lastly, a schematic arrangement for NMR spectroscopy of solids using the shuttle 15 according to the invention is illustrated in FIG. 6. The probe head 16 is installed in a magnet 11 so that the magnetic field required for the NMR measurement is present at the measurement site. By means of a transport system 12, as it is normally used for NMR spectroscopy of solid bodies, the rotor 5 filled with the substance to be examined and situated within the shuttle 15 according to the invention is pneumatically transported to the MAS probe head 16 by attaching the shuttle 15 to the MAS probe head 16 at position 15a, the locking device is unlocked and the rotor 5 can reach the measuring position 5a. For the measurement, the rotor axis is tilted in the MAS probe head 16 by the "magic angle." After the measurement, the rotor 5 is initially transported pneumatically from its measuring position 5a into the shuttle 15 at position 15a abutting the MAS probe head 16, and the shuttle 15 together with the rotor 5 is subsequently transported back into the starting position.

REFERENCE LIST (1) Body of the shuttle for an MAS rotor
(2) Control slide for actuating the locking mechanism of the MAS rotor
(2a) Actuating face of (2)
(2b) Slotted control guide on (2) for unlocking
(2c) Additional slotted control guide on (2) for manual unlocking
(2d) Stop on (2) for manual unlocking
(3) Ball as an exemplary locking element for the MAS rotor
(4) Cover
(5) MAS rotor with introduced substance to be examined
(5a) Measuring position of the MAS rotor (5)
(6) Manual actuating device for unlocking the MAS rotor
(6a) Recess in (6) for (9)
(7) Spring for (6)
(8) Plate of (6)
(9) Indicator, indicating if the shuttle is loaded with an MAS rotor
(9a) Actuating rod of (9)
(10) HR-NMR probe head
(11) NMR magnet
(12) Transport system for HR-NMR sample spinner (14)
(13) Transport system for MAS rotors (5)
(14) HR-NMR sample spinner
(14a) Measuring position of HR-NMR sample spinner (14)
(15) Shuttle according to the invention for MAS rotors (5)
(15a) Abutment position of shuttle (15) on MAS probe head (16)
(16) MAS probe head

PUBLICATIONS

Publications considered for the assessment of patentability

[1] "Z31123 Bruker Sample Transport," Version 002, Bruker BioSpin AG, Fällenden, Switzerland dated Nov. 21, 2008
[2] DE 10 2008 063 703
[3] DE 10 2008 054 152
[4] DE 101 11 674
[5] DE 103 43 405
[6] DE 10 2006 006 705
[7] JP S5 474 795A

We claim:

1. An NMR (Nuclear Magnetic Resonance) spectrometer for analysis of a liquid sample disposed within a sample spinner having a spinner outer diameter and for analysis of a solid sample disposed within an MAS (magic angle spinning) rotor having a rotor outer diameter which is less than the spinner outer diameter, the spectrometer comprising:
 a magnet having a tubular bore;
 a probe head disposed within said tubular bore of said magnet;
 a transport system disposed within said tubular bore, said transport system having a longitudinal inner volume structured to accept the sample spinner having the liquid sample;
 a shuttle movably disposed within said longitudinal inner volume of said transport system, said shuttle having a shuttle outer diameter which is substantially equal to the spinner outer diameter, said shuttle also having an inner bore structured to accept the MAS rotor in a displaceable manner, wherein said shuttle further comprises a locking device configured to fix the MAS rotor within said inner bore of said shuttle and to release the MAS rotor for transfer into said probe head.

2. The NMR spectrometer of claim 1, wherein said locking device is formed in such a manner that manual loading and removal of the MAS rotor is possible by manually actuating said locking device.

3. The NMR spectrometer of claim 1, wherein said locking device comprises a control slide which is displaceable in a longitudinal axis and transport axis of the shuttle when said shuttle abuts with said probe head, wherein said locking device comprises one locking element actuated transversely thereto via a slotted control guide of said control slide.

4. The NMR spectrometer of claim 3, wherein said locking element holding the MAS rotor is spherical.

5. The NMR spectrometer of claim 3, wherein said locking element holding the MAS rotor can be moved to a side by the MAS rotor due to gravity-loading thereof after unlocking by linearly displacing a tappet.

6. The NMR spectrometer of claim 3, further comprising an additional device for recognizing, from outside, if said shuttle is loaded with the MAS rotor.

7. A method for transporting an MAS rotor to and from a probe head in the NMR spectrometer of claim 1, wherein the MAS rotor is transported into the shuttle via one or more gas flows and the shuttle is also transported via one or more gas flows.

* * * * *